(12) United States Patent
Bertilsson

(10) Patent No.: US 7,978,041 B2
(45) Date of Patent: Jul. 12, 2011

(54) TRANSFORMER

(75) Inventor: Kent Bertilsson, Sundsvall (SE)

(73) Assignee: SEPS Technologies AB, Sundsvall (SE)

( * ) Notice: Subject to any disclaimer, the term of this patent is extended or adjusted under 35 U.S.C. 154(b) by 0 days.

(21) Appl. No.: 12/502,611

(22) Filed: Jul. 14, 2009

(65) Prior Publication Data

US 2010/0265023 A1     Oct. 21, 2010

(30) Foreign Application Priority Data

Apr. 16, 2009 (EP) ..................... 09158000

(51) Int. Cl.
*H01F 5/00* (2006.01)
(52) U.S. Cl. ................ 336/200; 336/223; 336/232
(58) Field of Classification Search .......... None
See application file for complete search history.

(56) References Cited

U.S. PATENT DOCUMENTS

| | | | | |
|---|---|---|---|---|
| 4,873,757 | A * | 10/1989 | Williams | 29/602.1 |
| 5,781,093 | A | 7/1998 | Grandmont et al. | |
| 6,501,364 | B1 | 12/2002 | Hui et al. | |
| 6,831,544 | B2 * | 12/2004 | Patel et al. | 336/200 |
| 6,888,438 | B2 | 5/2005 | Hui et al. | |
| 6,980,074 | B1 * | 12/2005 | Jitaru | 336/200 |
| 7,046,114 | B2 * | 5/2006 | Sakata | 336/200 |
| 2001/0020886 | A1 | 9/2001 | Matsumoto et al. | |
| 2004/0070481 | A1 | 4/2004 | Patel et al. | |
| 2008/0204180 | A1 * | 8/2008 | Aboumrad et al. | 336/92 |

FOREIGN PATENT DOCUMENTS

| | | |
|---|---|---|
| EP | 0935263 | 8/1999 |
| WO | 92/04723 | 3/1992 |
| WO | 2008/152616 | 12/2008 |

OTHER PUBLICATIONS

Garcia, O. et al, "A Standard Design Method for High Frequency PCB Transformers," 1995 IEEE, pp. 335-339.

* cited by examiner

*Primary Examiner* — Anh T Mai
(74) *Attorney, Agent, or Firm* — Dilworth & Barrese, LLP.

(57) ABSTRACT

A printed circuit board transformer comprises at least one primary winding and one secondary winding, each in the form of at least one layer of turns inside or at the surface of a printed circuit board. The transformer is designed for a step-up/down-operation. Each of the two layers (10, 11) has an elongated winding element (12, 13, 13') substantially following an elongated winding element of the other layer while being in an overlapping relationship therewith as seen perpendicularly to said printed circuit board over substantially the entire extension of said winding elements. A second (11) of the layers belonging to the secondary winding has a fewer number of turns than the first (10) of said layers belonging to said primary winding.

18 Claims, 4 Drawing Sheets

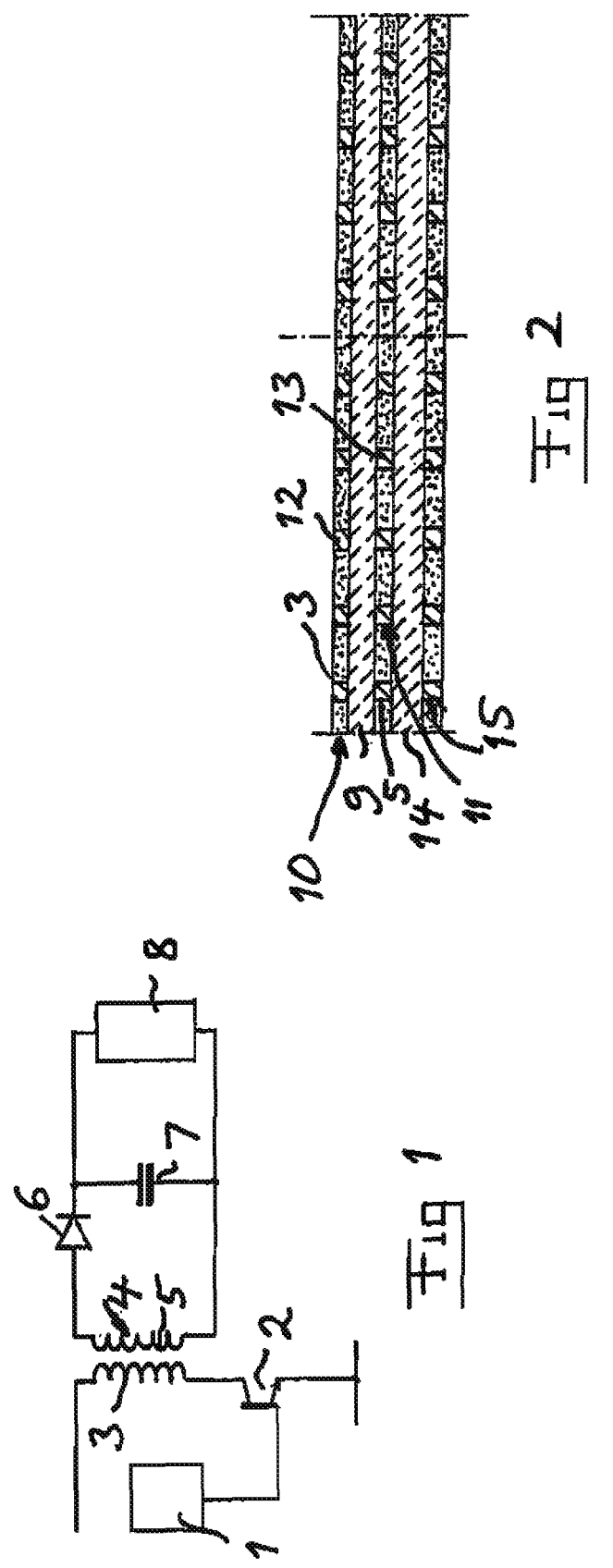

TRANSFORMER

TECHNICAL FIELD OF THE INVENTION AND BACKGROUND ART

The present invention relates to a printed circuit board trans-former comprising at least one primary winding and one secondary winding, each in the form of at least one layer of turns inside or at the surface of a printed circuit board, said transformer having a turn ratio of said primary winding to said secondary winding differing from 1:1 so as to achieve a step-up/down-operation.

Transformers of this type are used for transferring power and signals and for providing electric isolation and have for instance been proposed for isolated gate drive circuits for power MOS-FETs. It has turned out that such coreless printed circuit board transformers have desirable characteristics and can be employed for energy and digital signal transfer in low power applications, less than 100 W, in a high frequency range from a few hundred KHz to many MHz.

Furthermore, the invention is particularly directed to power transformers, i.e. transformers used for transfer of power, although the invention is neither restricted thereto.

A printed circuit board based transformer, often referred to as a planar transformer, is well known, through for example U.S. Pat. No. 6,501,364 B1. In such designs the use of a core material enhances the magnetic coupling between primary and secondary winding layers allowing an efficient power transfer even at relatively low frequencies. The size of the transformer will determine the total power capability and indeed the maximum frequency of operation. A higher switching frequency allows a smaller trans-former to be used for a given power level. Increasing frequency to be able to decrease the size of the transformer is limited by the increasing losses that occur in the core material. The demand for high efficiency has limited the maximum switching frequency used. Recent developments have increased the switching frequencies used, however, typical operation frequencies remain below 1 MHz. Removing the magnetic core of the transformer leads to reduced coupling between primary and secondary winding layer turns and a loss in efficiency. A coreless transformer of this type is known through for instance EP 0 935 263 A2, but the transformer described therein is used for isolation purposes and uses a 1:1 turns ratio at high frequency to maintain coupling efficiency and does not provide for any step-up/down-operation.

The invention is particularly directed to transforming alternating voltages of a high frequency, such as in the range of 1-30 MHz. In order for the transformer to work efficiently at these frequencies and without a magnetic core it is necessary to obtain a very high coupling factor for the coupling of the magnetic fields of the primary winding and the secondary winding. This means that the local magnetic fields of the respective winding have to be in a good overlapping relationship, which may be obtained by arranging these windings close to each other. The distance between these windings may also, however, not be too close as, this would jeopardize the personal security and increase the capacitance and the resulting parasitic losses, a typical separation may be around 0.4 mm. The transformer according to the invention should provide for a step-up/down-operation, this significantly increases the complexity of the design of primary and secondary windings required to obtain a said high coupling factor necessary for enabling high operation frequencies.

SUMMARY OF THE INVENTION

The object of the present invention is to provide a transformer of the type defined in the introduction, which especially solves the problem of being able to operate at high frequencies.

This object is according to the invention obtained by providing such a transformer, in which each of said two layers has an elongated winding element substantially following an elongated winding element of the other layer while being in an overlapping relationship therewith as seen perpendicularly to said printed circuit board over substantially the entire extension of said winding elements, and the second of said layers belonging to said secondary winding has a fewer number of turns than the number of turns of a first of said layers belonging to said primary winding.

By ensuring that said elongated winding elements, such as insulated copper wires, are in said overlapping relationship and these winding elements accordingly closely follow each other a good overlap of local magnetic fields of the primary winding with the secondary winding and by that a high coupling factor will be obtained without any need of a core given that the transformer is operated at high frequencies without degraded performance due to increased core losses. This also means that the inductance of the transformer may be lowered.

According to an embodiment of the invention each turn of said second winding layer has a larger cross-section for current flowing therein than each turn of said first winding layer. This results in a lower series resistance of the transformer reducing resistive losses and enabling an increase of the power that may be transferred therethrough. This means that such a transformer of a rather small size may be used for powers up to 100 W.

According to another embodiment of the invention said second winding layer comprises a segment of a plurality of said elongated winding elements connected in parallel with each other and configured to extend so that each said elongated winding element is in said overlapping relationship with an elongated winding element in said first winding layer. This constitutes a very advantageous way of obtaining said step-up/down-operation while still obtaining a nearly perfect overlap and by that a high coupling factor and high possible operation frequencies. Furthermore, to connect said winding elements in parallel in this way constitutes a very efficient way to reduce the series resistance of the transformer while increasing the total cross-section for the current flowing in each turn. Note that at high frequencies the penetration of an electrical signal flowing in an electrical conductor is limited to the near surface, the so-called Skin Effect, as a result a large surface area is important to achieve low series resistance rather than thickness of the metal layer as would be the case at low frequencies. The series resistance may be efficiently reduced by instead increasing the numbers of elongated elements in each turn.

According to another embodiment of the invention said plurality of elongated winding elements of said segment are connected to each other at the outer periphery of the secondary winding and at the centre thereof. This means that the elongated winding elements of said second winding layer may perfectly follow the corresponding elongated winding elements of the first winding layer for obtaining a good overlap of local magnetic fields aimed at.

According to another embodiment of the invention said segment comprises two said elongated winding elements connected in parallel for obtaining a turn ratio of 2:1 of said first winding layer with respect to said second winding layer. This number of winding elements connected in parallel and three and four such winding elements connected in parallel according to other embodiments of the invention constitutes preferred embodiments of the invention.

According to another embodiment of the invention the trans-former comprises a portion of the printed circuit board arranged next to said second winding layer and having a third winding layer on the opposite side thereof with respect to said second winding layer and with an elongated winding element thereof substantially following the elongated winding element of said second winding layer while being in an overlapping relationship therewith as seen perpendicularly to said printed circuit board over substantially the entire extension of these winding elements, and said first and third winding layers are connected in series for both belonging to said primary winding and having the same number of turns. By arranging said first and third winding layers on opposite sides of said second winding layer with printed circuit board portions therebetween a high coupling of the local magnetic fields may be obtained for both the first and third winding layer with respect to the second winding layer, so that a high operation frequency is possible, and the turn ratio will by this be increased with a further factor of 2, so that the inductance of one of the transformer windings will be increased.

According to another embodiment of the invention the trans-former comprises two pairs of a said first winding layer and a said second winding layer with a respective printed circuit board arranged therebetween, and the two first winding layers are connected in series and the two second layers are connected in parallel while belonging to the primary winding and the secondary winding, respectively, of the transformer. The arrangement of two such pairs instead of one pair results in an increased inductance in the primary windings and a reduced inductance in the secondary windings totally resulting in a higher turn ratio. It also results in a reduction of the resistance of windings connected in parallel.

According to another embodiment of the invention said second winding layer has fewer number of turns than said first winding layer by comprising an elongated element member being substantially wider in the cross-section dimension thereof as seen in parallel with said printed circuit board so as to be in said overlapping relationship with two adjacent turns of the elongated winding element of said first winding layer for obtaining a turn ratio of 1:2 with respect thereto. This constitutes another way of obtaining a step-up/down-operation of the transformer and lowering the series resistance.

According to another embodiment of the invention said winding layers of the transformer are configured to have the same extension as seen in the direction of the current to flow therein, i.e. all extending in said direction towards the centre of the winding layer or all away from the centre of the winding layer. This way of arranging the different winding layers of the transformer results in a possibility to a perfect match, i.e. that the elongated winding elements of adjacent winding layers perfectly follow each other over the entire extension thereof for obtaining a good overlap of local magnetic fields, so that operation at very high frequencies may be possible without unacceptable disturbances.

According to another embodiment of the invention the trans-former comprises three or more said layers each forming a said first or second layer and arranged in said overlapping relationship with respect to each other. Thus, the transformer may have any number of such layers and they may be arranged in any conceivable order, and it has in fact turned out that the efficiency of the transformer may be different for the same number of such layers arranged in different orders, such as for instance in the order second layer, first layer, first layer and second layer compared to the order first layer, second layer, second layer and first layer.

According to another embodiment of the invention the transformer is a coreless transformer or a transformer provided with a core.

According to another embodiment of the invention the trans-former is configured to transfer powers of 1 W-100 W, preferably 10 W-100 W, between the primary and secondary winding thereof. Powers within these ranges may thanks to acceptably low losses be transferred through a transformer according to the present invention.

According to another embodiment of the invention the transformer is configured to transform alternating voltages having a frequency of 1-50 MHz or 2-10 MHz.

The invention also relates to a laptop having a transformer according to any of the above embodiments of the invention built in within the shell thereof, and accordingly a use of a trans-former according to the invention in a laptop. This constitutes a very preferred use of a transformer according to the invention, which may be built in within the shell thanks to the small dimensions thereof, so that no separate transformer outside the shell is necessary.

Further advantages as well as advantageous features of the invention will appear from the following description.

BRIEF DESCRIPTION OF THE DRAWINGS

With reference to the appended drawings, below follows a specific description of embodiments of the invention cited as examples.

In the drawings:

FIG. 1 is a very simplified circuit diagram showing a typical use of a transformer according to the invention, FIG. 2 is a simplified cross-section view of a part of a trans-former according to the present invention.

DETAILED DESCRIPTION OF EMBODIMENTS OF THE INVENTION

Figure 3:
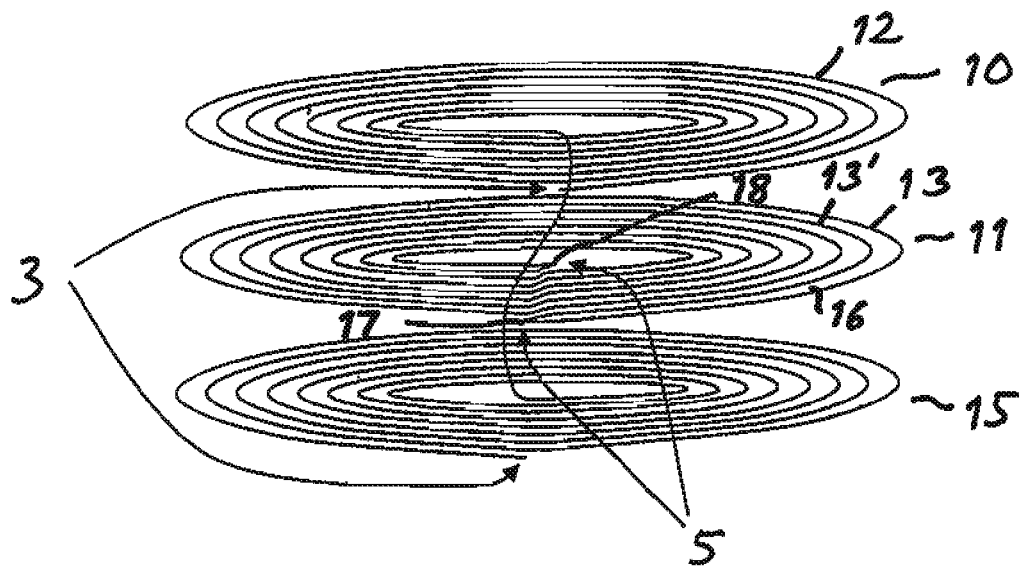
FIG. 3 is a very simplified view illustrating the windings of a transformer according to a first embodiment of the invention.

The circuit diagram of FIG. 1 very schematically shows a typical use of a printed circuit board transformer for power transfer according to the present invention. It is shown how a gate drive circuit 1 controls a semiconductor transistor switch 2 for controlling an alternating voltage signal to a primary winding 3 of a said printed circuit board transformer 4 having a secondary winding 5 connected to a circuit with a diode 6 and a capacitor 7 for transferring power to a load 8, such as for instance a laptop. Losses in this circuit are mainly created in the transistor 2, the transformer 4 and of course the load 8. As already stated, it is desired to be able to operate at high frequencies and to reduce the dimensions of inductive and capacitive devices while enabling transfer of comparatively high powers when necessary.

FIG. 2 schematically illustrates how a printed circuit board trans-former 4 is principally designed with a primary winding 3 and a secondary winding 5 each deposited in the form of one layer of turns on opposite sides of or within a printed circuit board 9. The embodiment schematically shown in FIG. 2 is the same as the one shown in FIG. 3, and reference is now made to both these Figures. Each of these two winding layers 10, 11 has an elongated winding element 12, 13 substantially following an elongated winding element of the other layer while being in an overlapping relationship therewith as seen perpendicularly to said printed circuit board 9 over substantially the entire extension of said winding elements. How this is obtained in detail will be further explained below.

The transformer also has a portion 14 of the printed circuit board arranged next to the second winding layer 11 and having a third winding layer 15 on the opposite side thereof with respect to said second winding layer and with an elongated winding element thereof substantially following the elongated winding element 13 of the second winding layer 11 while being in an overlapping relationship therewith as seen perpendicularly to said printed circuit board 9 over substantially the entire extension of these winding elements. Said first 10 and third 15 winding layers are connected in series for both belonging to the primary winding 3 and having the same number of turns. This is shown in FIG. 3.

It is also shown in FIG. 3 that the second winding layer 11 comprises a segment 16 of two elongated winding elements 13, 13' connected in parallel with each other and configured to extend so that each said elongated winding element is in said overlapping relationship with an elongated winding element in said first winding layer 10 and said third winding layer 15. The elongated winding elements 13, 13' of the segment are connected to each other at the outer periphery 17 of the segment and at the centre 18 thereof. It is in this way obtained that the elongated elements 13, 13' of the second winding layer extend closely along the elongated winding elements of the first and third winding layers for obtaining a good overlap of local magnetic fields and by that a high coupling factor making it possible to operate the trans-former for high frequencies with high efficiency.

Furthermore, the parallel connection of the elongated winding elements 13, 13' results in half as many turns in that winding layer as in each of the other two winding layers 10, 15, which together with the series connection of the winding layers 10, 15 results in a turn ratio of 4:1 of the transformer.

Another advantage of said parallel connection of winding elements 13, 13' in the second winding layer 11 is that this increases the cross-section felt by the current flowing therethrough and by that reduces the series resistance of the parallel connected windings, so that it may take higher currents.

Figure 4:
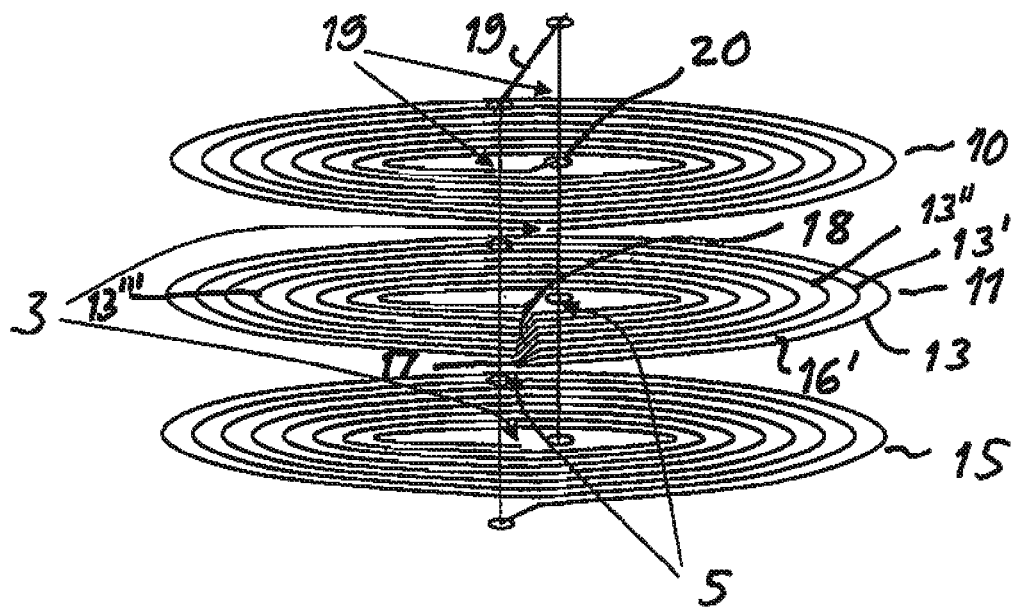
FIG. 4 is a view corresponding to FIG. 3 for a transformer according to a second embodiment of the invention.

FIG. 4 illustrates a transformer according to a second embodiment of the invention differing from the transformer shown in FIG. 3 in two respects. The first one is that the second winding layer 11 has here a segment 16' of four elongated winding elements 13, 13', 13'', 13''' connected in parallel with each other and configured to extend so that each said elongated winding element is in said overlapping relationship with an elongated winding element in said first and third winding layers. This means that the turn ratio will be increased to be 8:1 and the series resistance of the parallel windings will be further reduced. The other difference is that thanks to the connection of the two primary winding layers 10, 15 by vias 19 running through holes 20 centrally and peripherally located in the printed circuit boards these winding layers may be configured to have the same extension and also the same extension as the winding layer 11 as seen in the direction of the current to flow therein, i.e. all extending in said direction towards the centre of the winding layer or all away from the centre of the winding layer. Accordingly, this means that if we assume that the current flows clockwise as seen in FIG. 4 it will in all the layers 10, 11, 15 flow from the centre and outwardly. This results in a very good match of the extension of the winding elements in the layers and a high magnetic coupling factor.

Figure 5:
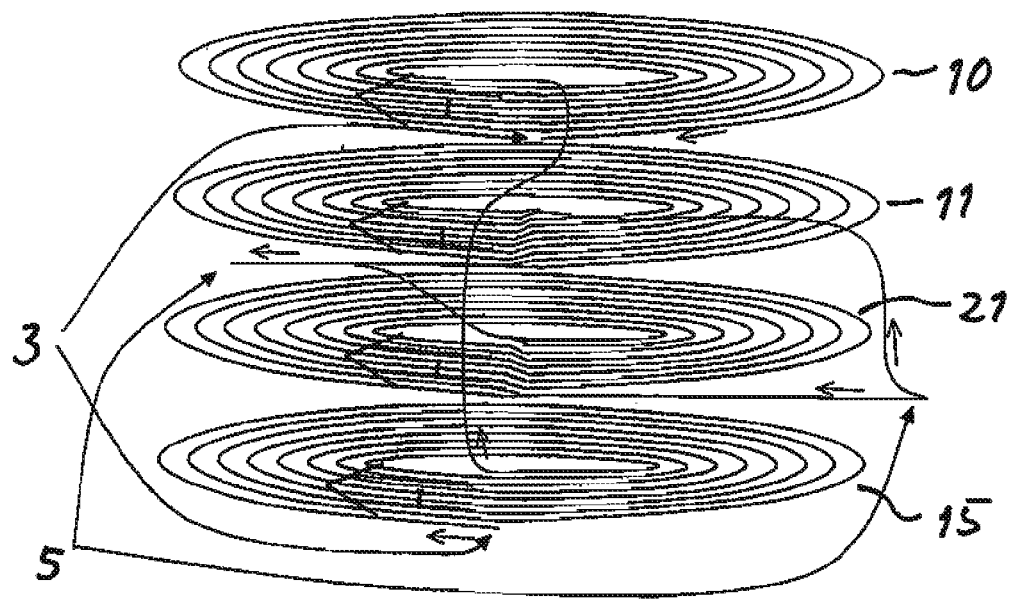
FIG. 5 is a view corresponding to FIG. 3 for a transformer according to a third embodiment of the invention.

FIG. 5 schematically illustrates the winding layers of a trans-former according to a third embodiment of the invention having two outer primary winding layers 10, 15 connected in series and each arranged in an overlapping relationship with a secondary winding layer 11, 21 each, which has the same design as the secondary winding layer 11 in the embodiment shown in FIG. 3. The two secondary winding layers are connected in parallel with each other. The turn ratio of this transformer will be 1:2 and accordingly the same as would for instance only the two layers 10, 11 be there, but the series resistance of the transformer will be reduced thanks to four elongated winding elements connected in parallel in the secondary winding of the transformer, so that the transformer may take higher currents and lower losses will be generated.

Figure 6:
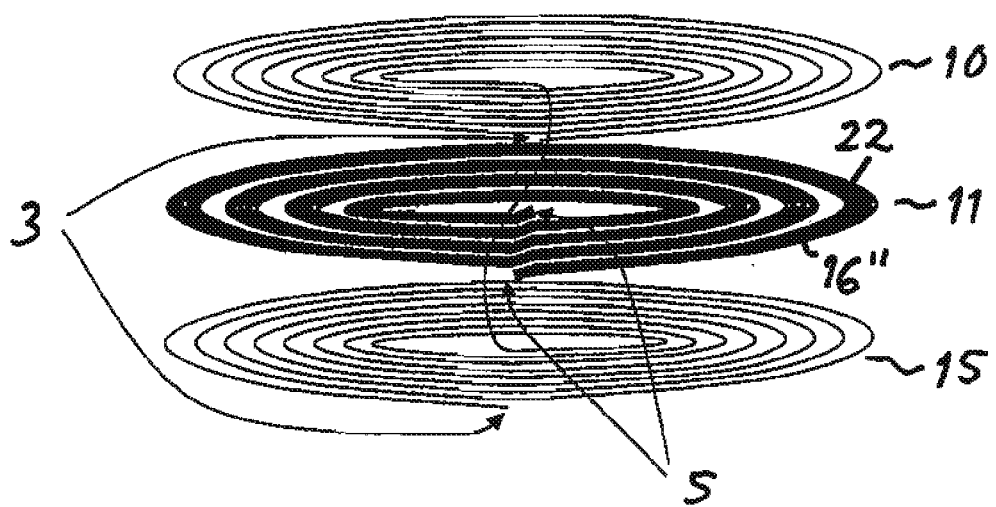
FIG. 6 is a view corresponding to FIG. 3 for a transformer according to a fourth embodiment of the invention.

FIG. 6 illustrates a transformer according to a fourth embodiment of the invention differing from the embodiment shown in FIG. 3 by the fact that the space between the two elongated elements of the segment 16' of the winding layer 11 belonging to the secondary winding is filled out, so that the segment 16'' is in fact replaced by one single elongated winding element 22 having a larger cross-section dimension in the direction parallel with the printed circuit board in question. Such a wider winding element may conduct a higher current than a thin one, although the skin effect may reduce this advantage for higher frequencies. The magnetic coupling factor will also be slightly lower in this embodiment than in the embodiment shown in FIG. 3. This is due to increased eddy currents in the wider winding and that the local magnetic field does not surround the entire winding as good as in a narrower conductor.

Figure 7:
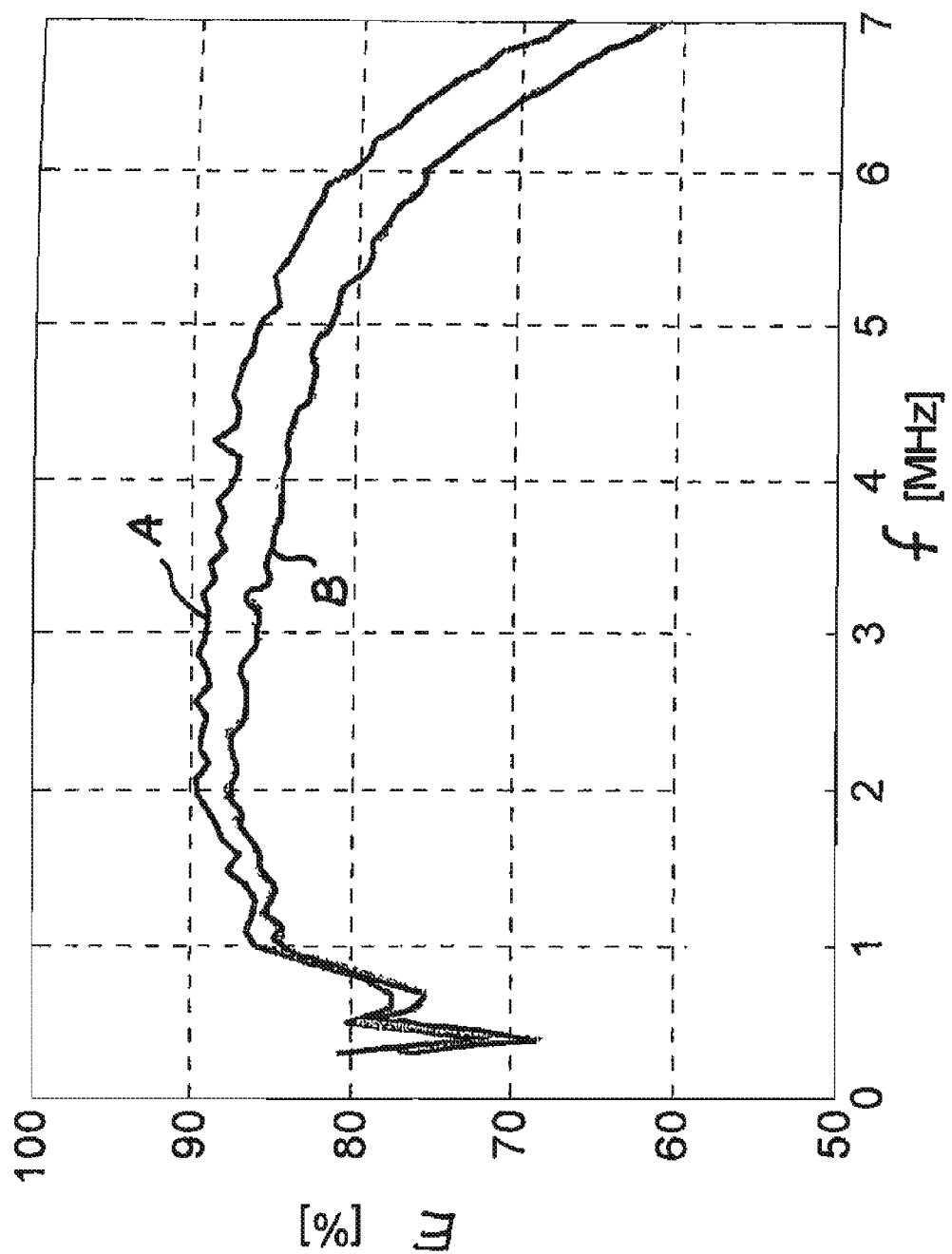
FIG. 7 is a graph of efficiency versus frequency for two trans-formers according to FIG. 5 having secondary winding layers with three parallel conductors and one single conductor, respectively.

Measurements of the relationship of efficiency and frequency of two transformers of the type shown in FIG. 5 have been carried out. A first transformer A of these transformers had secondary winding layers with three parallel conductors and the other transformer B had the secondary winding layers of one single solid conductor, as shown for the secondary winding layer in the embodiment according to FIG. 6. The efficiency E of these two transformers versus frequency f is shown in the graph of FIG. 7. It appears that the efficiency of the transformer A having parallel conductors is in the order of 2-7% higher than for the transformer B in the frequency range of 1 MHz-7 MHz, and that this difference increases with the frequency.

The invention is of course not in any way restricted to the embodiments described above, but many possibilities to modifications thereof will be apparent to a person with ordinary skill in the art without departing from the scope of the invention as defined in the appended claims.

The secondary winding is in this disclosure merely defined as the winding having fewer number of turns than the other winding, called primary winding. This shall, however, include step-up transformers as well as step-down transformers.

It is pointed out that the printed circuit board may be a multiple layer board, so that in the embodiment shown in FIG. 2 there is only one printed circuit board and the second winding layer 11 is arranged within this printed circuit board. The layers of the transformer may also all be entirely or partially arranged in the printed circuit board and be arbitrary to the number and connected in series and/or in parallel with each other. The order of the layers may also be arbitrary.

The invention claimed is:

1. A printed circuit board transformer comprising
at least one primary winding (3,5) and one secondary winding (11), each in the form of at least one layer of turns inside or at the surface of a printed circuit board (9), said transformer having a turn ratio of said primary winding to said secondary winding differing from 1:1 to achieve a step-up/down-operation,
wherein each of said two layers has an elongated winding element (12, 13, 13', 13", 13'") substantially following an elongated winding element of the other layer while being in an overlapping relationship therewith as seen perpendicularly to said printed circuit board (9) over substantially the entire extension of said winding elements,
a second (11) of said layers belonging to said secondary winding has a fewer number of turns than the number of turns of a first (10) of said layers belonging to said primary winding, and
said second winding layer (11) comprises a segment (16, 16') of a plurality of said elongated winding elements (13, 13', 13", 13'") connected in parallel with each other within said layer (11) and configured to extend within said layer (11) such that each said elongated winding element is in said overlapping relationship with an elongated winding element (12) in said first winding layer (10).

2. A transformer according to claim 1, wherein each turn of said second winding layer (11) has a larger cross-section for current flowing therein than each turn of said first winding layer (10).

3. A transformer according to claim 2, wherein said second winding layer (11) comprises a segment (16, 16') of a plurality of said elongated winding elements (13, 13', 13", 13'") connected in parallel with each other and configured to extend so that each said elongated winding element is in said overlapping relationship with an elongated winding element (12) in said first winding layer (10).

4. A transformer according to claim 3, wherein said plurality of elongated winding elements (13, 13', 13", 13'") of said segment (16, 16') are connected to each other at the outer periphery (17) of the secondary winding and at the center (18) thereof.

5. A transformer according to claim 4, wherein said segment (16) comprises two said elongated winding elements (13, 13') connected in parallel for obtaining a turn ratio of 2:1 of said first winding layer (10) with respect to said second winding layer (11).

6. A transformer according to claim 1, wherein said plurality of elongated winding elements (13, 13', 13", 13'") of said segment (16, 16') are connected to each other at the outer periphery (17) and center (18) of said single secondary winding layer (11).

7. A transformer according to claim 6, wherein said segment (16) comprises two said elongated winding elements (13, 13') connected in parallel for obtaining a turn ratio of 2:1 of said first winding layer (10) with respect to said second winding layer (11).

8. A transformer according to claim 1, wherein said segment (16) comprises two said elongated winding elements (13, 13') connected in parallel for obtaining a turn ratio of 2:1 of said first winding layer (10) with respect to said second winding layer (11).

9. A transformer according to claim 1, wherein said segment (16) comprises three said elongated winding elements connected in parallel for obtaining a turn ratio of 3:1 of said first winding layer with respect to said second winding layer.

10. A transformer according to claim 1, wherein said segment (16') comprises four said elongated winding elements (13, 13', 13", 13'") connected in parallel for obtaining a turn ratio of 4:1 of said first winding layer (10) with respect to said second winding layer (11).

11. A transformer according to claim 1, comprising a portion (14) of the printed circuit board arranged next to said second winding layer (11) and having a third winding layer (15) on the opposite side thereof with respect to said second winding layer and with an elongated winding element thereof substantially following the elongated winding element of said second winding layer while being in an overlapping relationship therewith as seen perpendicularly to said printed circuit board over substantially the entire extension of these winding elements, and
said first (10) and third (15) winding layers are connected in series for both belonging to said primary winding and having the same number of turns.

12. A transformer according to claim 1, comprising two pairs of said first winding layer (10, 15) and said second winding layer (11, 21) with a respective printed circuit board arranged therebetween, and
the two first winding layers are connected in series and the two second winding layers are connected in parallel while belonging to the primary winding and the secondary winding, respectively, of the transformer.

13. A transformer according to claim 1, wherein said second winding layer (11) has a fewer number of turns than said first winding layer by comprising an elongated winding element (22) being substantially wider in the cross-section dimension thereof as seen in parallel with said printed circuit board to be in said overlapping relationship with two adjacent turns fo the elongated winding element of said first winding layer (10) for obtaining a turn ratio of 1:2 with respect thereto.

14. A transformer according to claim 1, comprising three or more said layers each forming said first or second layer and arranged in said overlapping relationship with respect to each other.

15. A transformer according to claim 1, wherein said winding layers (10, 11, 15) of the transformer are configured to have the same extension as seen in the direction of the current to flow therein, all extending in said direction towards the center of the winding layer or all away from the center of the winding layer.

16. A transformer according to claim 1, wherein it is a coreless transformer or a transformer provided with a core.

17. A transformer according to claim 1, configured to transfer powers of 1 W-100 W, preferably 10 W-100 W, between the primary and secondary winding thereof.

18. A transformer according to claim 1, configured to transform alternating voltages having a frequency of 1-50 MHz, or 2-10 MHz.

* * * * *